US010663487B2

(12) United States Patent
Audette et al.

(10) Patent No.: US 10,663,487 B2
(45) Date of Patent: May 26, 2020

(54) LOW FORCE WAFER TEST PROBE WITH VARIABLE GEOMETRY

(71) Applicant: International Business Machines Corporation, Armonk, NY (US)

(72) Inventors: David M. Audette, Colchester, VT (US); Dennis R. Conti, Essex Junction, VT (US); Marc D. Knox, Hinesburg, VT (US); Grant W. Wagner, Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/288,977

(22) Filed: Feb. 28, 2019

(65) Prior Publication Data
US 2019/0195913 A1    Jun. 27, 2019

Related U.S. Application Data

(63) Continuation of application No. 15/208,212, filed on Jul. 12, 2016, now Pat. No. 10,261,108.

(51) Int. Cl.
*G01R 1/073* (2006.01)
*G01R 31/28* (2006.01)

(52) U.S. Cl.
CPC ..... *G01R 1/07307* (2013.01); *G01R 1/07321* (2013.01); *G01R 31/2886* (2013.01)

(58) Field of Classification Search
CPC .......... G01R 1/07307; G01R 31/2886; G01R 1/07321; H01L 22/34; H01L 2924/0002; H01L 2924/00

USPC ........ 324/500, 600, 754.07, 755.01–758.01, 324/425, 437, 754.1, 754.11, 690.696, 324/715

See application file for complete search history.

(56) References Cited

U.S. PATENT DOCUMENTS

| | | |
|---|---|---|
| 5,461,326 A | 10/1995 | Woith et al. |
| 6,181,149 B1 | 1/2001 | Godfrey et al. |
| 6,469,531 B1 | 10/2002 | Sayre et al. |
| 6,690,185 B1 | 2/2004 | Khandros et al. |
| 7,086,149 B2 | 8/2006 | Eldridge et al. |
| 7,394,265 B2 | 7/2008 | Kojima |
| 7,560,941 B2 * | 7/2009 | Martens ............. G01R 1/07342 324/750.03 |
| 7,629,804 B2 | 12/2009 | Nguyen et al. |

(Continued)

OTHER PUBLICATIONS

J. U. Knickerbocker et al., "2.5 D and 3D technology challenges and test vehicle demonstrations," 62nd Electronic Components and Technology Conference (ECTC), 2012, pp. 1068-1076.

(Continued)

*Primary Examiner* — Melissa J Koval
*Assistant Examiner* — Trung Nguyen
(74) *Attorney, Agent, or Firm* — Cantor Colburn LLP; Erik Johnson

(57) ABSTRACT

A system for testing functionality of die on a wafer including a plurality of contacts includes a support structure and a plurality of probes mounted to the support structure in an array. A configuration of each of the plurality of probes varies based on a position of the probe within the array to maintain uniform engagement between the plurality of probes and a corresponding plurality of contacts across the array.

21 Claims, 8 Drawing Sheets

(56) References Cited

U.S. PATENT DOCUMENTS

| | | |
|---|---|---|
| 7,843,198 B2 | 11/2010 | Sato et al. |
| 8,487,304 B2 | 7/2013 | Chey et al. |
| 10,261,108 B2 | 4/2019 | Audette et al. |
| 2004/0004216 A1* | 1/2004 | Eldridge ............ G01R 1/07307 257/48 |
| 2010/0071100 A1 | 3/2010 | Faris |
| 2018/0017592 A1 | 1/2018 | Audette et al. |

OTHER PUBLICATIONS

List of IBM Patents or Patent Applications Treated as Related; (Appendix P), Filed Apr. 22, 2019; 2 pages.

* cited by examiner

LOW FORCE WAFER TEST PROBE WITH VARIABLE GEOMETRY

DOMESTIC PRIORITY

This application is a continuation of U.S. application Ser. No. 15/208,212, titled, "LOW FORCE WAFER TEST PROBE WITH VARIABLE GEOMETRY", which was filed Jul. 12, 2016. The entire contents of U.S. application Ser. No. 15/208,212 are incorporated by reference herein.

BACKGROUND

The present invention generally relates to testing wafers on which electronic circuits are formed, and more particularly, to a test configuration for testing an electronic circuit.

An important facet of the semiconductor industry resides in being able to provide satisfactorily functioning semiconductor devices. In particular, such semiconductor devices may comprise wafers which are divided into areas which form chips, the shapes and dimensions of which are as close to identical as possible, so as to impart consistent uniform electrical properties thereto.

Generally, semiconductor devices on chips are ordinarily connected to each other with thin strips of metal, referred to in the art as interconnection metallurgy, which in turn contact the wafer surface through a series of pads or bumps. Other connector pad configurations may include an array of electrical contacts or bumps which are distributed over an area; for instance, the widely employed C4 bumps (controlled collapse chip connects). Such bumps or electrical contacts extend above the integrated circuits and have a generally spherical or round cross-sectional configuration.

Although wafers are formed as uniformly as possible through current manufacturing techniques, it is not always feasible that every chip produced is perfect. In order to identify defective chips, electrical tests are performed to facilitate the sorting out of good chips and eliminating defective chips prior to the next step of manufacture.

Ordinarily, active testing of the wafers is performed by a test facility in which the pads or areas on wafers possessing arrays of bumps, such as of C4 bumps, are contacted by an assembly incorporating test probes. In order to successfully probe the integrity of the pads or bumps, it is desirable that an oxide layer, which inevitably forms on the surface of the C4 bumps, be ruptured and penetrated to ensure good electrical contact with the probe while employing only a minimal force to inhibit damaging the pads or bumps.

A substrate having a plurality of probes mounted thereto is used to perform a test on the plurality of C4 bumps of a wafer simultaneously. Each probe technology has a characteristic system compliance or spring rate, thus the correct probe force occurs at a specific probe displacement relative to the wafer. Consequently, current wafer testing practice is to displace the wafer the specified distance into the probe system. Unfortunately, the resulting forces may result in significant deflection of the probe support structure. This may be especially problematic for rigid probe arrays that incorporate a large number of probes because overdrive must be increased to overcome deflection of the support structure. As a result, the contact area, and therefore the contact force, applied by the probes to each of the plurality of C4 bumps may vary across the array.

SUMMARY

In one aspect, the present invention provides a system for testing functionality of die on a wafer including a plurality of contacts includes a support structure and a plurality of probes mounted to the support structure in an array. A configuration of each of the plurality of probes varies based on a position of the probe within the array to maintain uniform engagement between the plurality of probes and a corresponding plurality of contacts across the array.

In one aspect, an embodiment of the present invention provides a system for testing functionality of die on a wafer including a plurality of contacts includes a support structure and a plurality of probes mounted to the support structure in an array. A configuration of each of the plurality of probes is selected based on an expected deflection of the support structure at a position associated with each of the plurality of probes.

In one aspect, an embodiment of the present invention provides a method of forming a probe array includes determining an expected deflection of a support structure of the probe array and connecting a plurality of probes to the support structure. A configuration of each of the plurality of probes is dependent on the expected deflection of the support structure at a position of the probe.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not, therefore, to be considered to be limiting of its scope, the invention will be described and explained with additional specificity and detail through the use of the accompanying drawings.

DETAILED DESCRIPTION

Citation of "a specific embodiment" or a similar expression in the specification means that specific features, structures, or characteristics described in the specific embodiments are included in at least one specific embodiment of the present invention. Hence, the wording "in a specific embodiment" or a similar expression in this specification does not necessarily refer to the same specific embodiment.

Hereinafter, the present invention and various embodiments of the present invention will be described in more detail with reference to the accompanying drawings. Nevertheless, it should be understood that the present invention could be modified by those skilled in the art in accordance with the following description to achieve the excellent results of the present invention. Therefore, the following description shall be considered as a pervasive and explanatory disclosure related to the present invention for those skilled in the art, not intended to limit the claims of the present invention.

Figure 1:
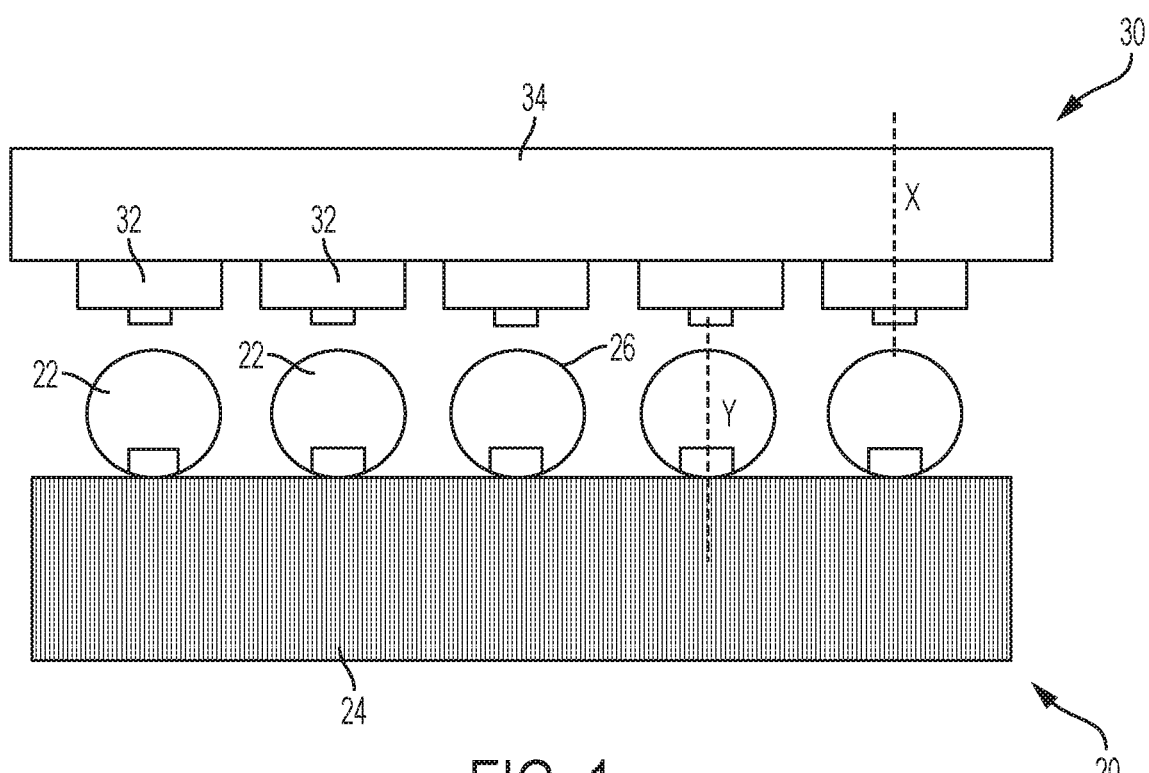
FIG. 1 is a side view of a system including an array of probes and a wafer in an inactive position according to an embodiment.

Referring now to FIG. 1, an example of an array 30 of test probes 32 used to test the functionality of die on a semiconductor wafer 20 is illustrated. The semiconductor wafer 20 includes a plurality of conductive bumps 22, also referred to as controlled collapse chip connects ("C4 bumps"), which have a generally spherical or curved top shape. The semiconductor wafer 20 may include a base layer 24 formed from a substrate, such as a silicon material for example, having a specific structure or openings. The base layer 24 may include a single or multiple layers of material. The wafer 20 as supported in a test fixture may or may not have the capability of moving in one or more directions prior to electrical contact for indexing the position of the wafer 20 and the circuit on the wafer 20 to be tested.

Figure 2:
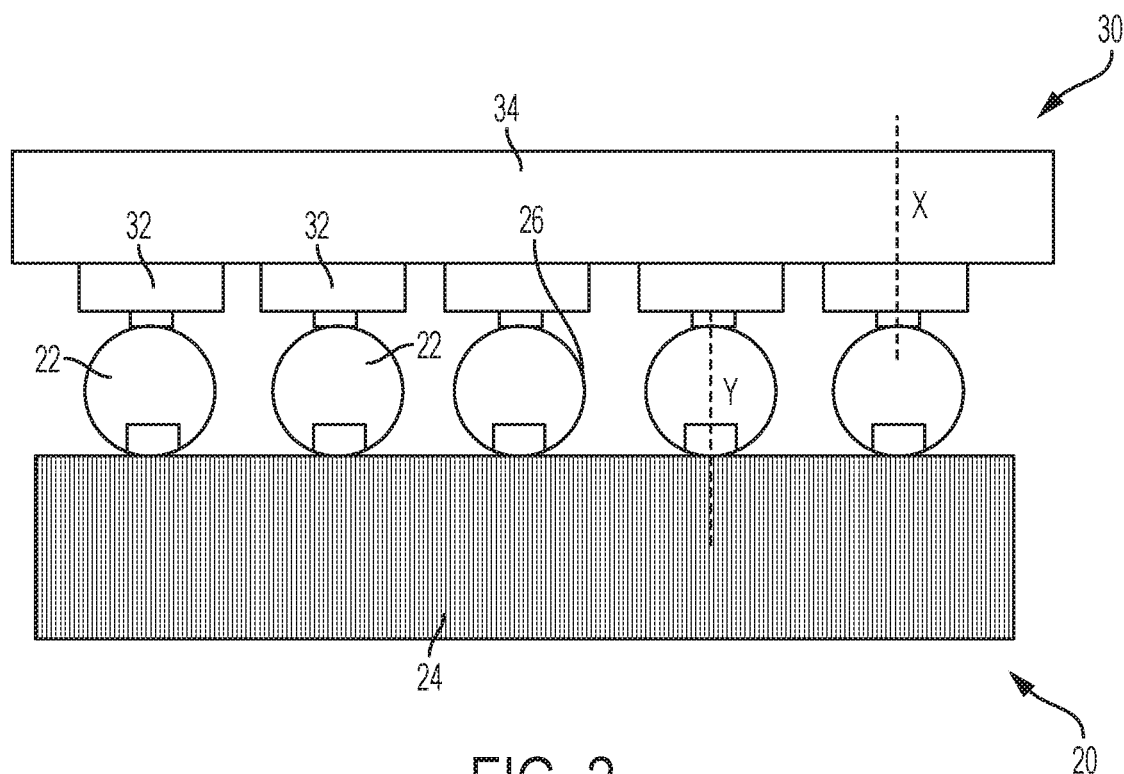
FIG. 2 is a side view of a system including an array of probes and a wafer in an active position according to an embodiment.

As shown, the probes 32 of the array 30 are mounted to a support structure 34 in a configuration such that each probe 32 is substantially aligned with one of the C4 bumps 22 on a semiconductor wafer 20. Each of the probes 32 has a longitudinal axis X which passes through the center of the probe 32 such that a height of each probe 32 may be measured along the longitudinal axis. The longitudinal axis X of the probes 32 is generally aligned with a longitudinal axis Y (FIG. 2) of each of the C4 bumps 22. When the probe 32 is in contact with C4 bumps 22, the distance between the structure 34 and the C4 bumps 22 is less than the length of the probes 32, to ensure that a pressure or force is applied to each of the C4 bumps 22. The pressure or force provides penetration of the C4 bumps 22 resulting in piercing and exposing a new clean contact surface free of oxide below the former surface 26 of the C4 bump 22.

Figure 3:
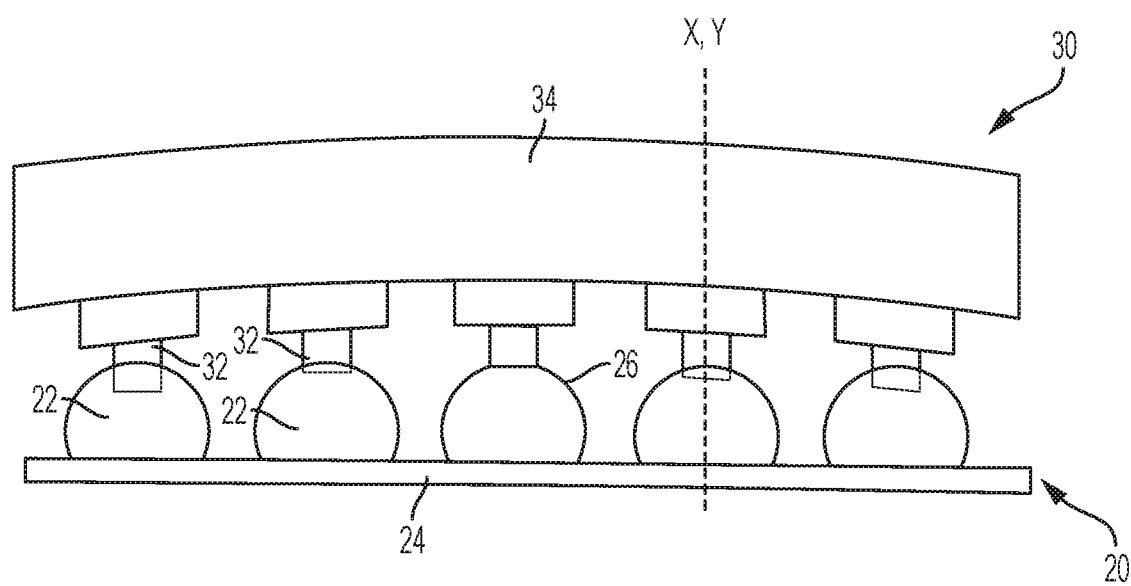
FIG. 3 is a side view of a system including an array of probes and a wafer depicting bowing of the substrate under test load according to an embodiment.

Typically each of the plurality of probes 32 arranged within a conventional array 30 is substantially identical. As the support structure 34, and therefore the probes 32, is moved into contact with the C4 bumps 22, the support structure 34 tends to deflect or bow, as shown in FIG. 3. This deflection, which occurs based on how the support structure 34 is supported relative to the test fixture, the force per probe, and the number of probes 32, causes the contact area between each probe 32 and a corresponding C4 bump 22, and the contact force applied thereto, to vary across the array 30. As shown in the FIG., the probes 32 arranged at the ends or exterior of the array 30 have increased contact with the corresponding C4 bumps 22, and therefore apply an increased force thereto.

To compensate for deflection of the support structure 34 that occurs under a test load, whether measured or modeled deflection, the configuration of one or more of the probes 32 within an array 30 is varied. In an embodiment, the configuration of one or more probes 32 of the array 30 is selected such that uniformity of one or more of the contact area, displaced solder volume, and final force applied by each probe 32 is achieved at the interface between each probe 32 and a corresponding C4 bump 22, regardless of the location within the array 30.

Figure 4:
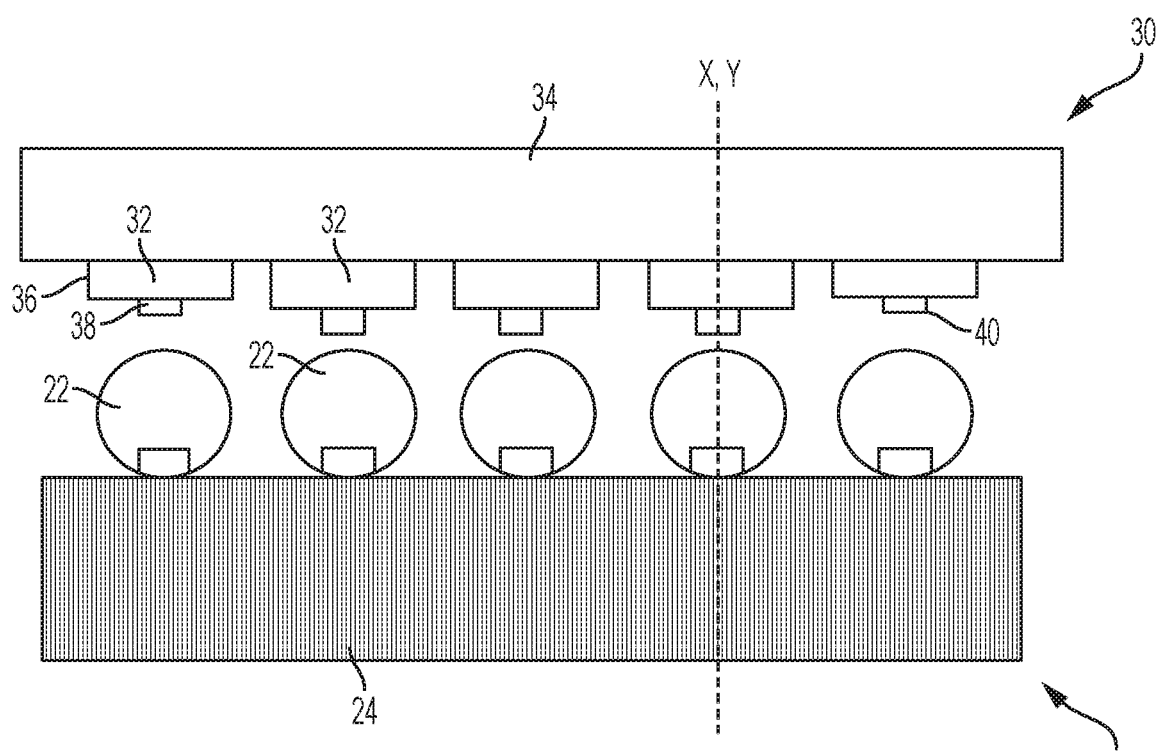
FIG. 4 is a side view of a system including an array of probes having varying configurations according to an embodiment.

This customization of the probes 32 to achieve one or more uniform properties across the array 30 may include altering one or more elements of the probe geometry. For example, the height of the probe 32, and therefore the height at which the probe 32 contacts a corresponding C4 bump 22 can be varied across the array. In the illustrated, non-limiting embodiment of FIG. 4, the height of the pedestal 36 of one or more probes 32 and/or the height of the feature 38 extending from the pedestal 36 configured to contact the C4 bump 22 may vary across the array, so that plurality of probes 32 contacts the spherical surfaces of an array of C4 bumps 22 at different heights.

Figure 5:
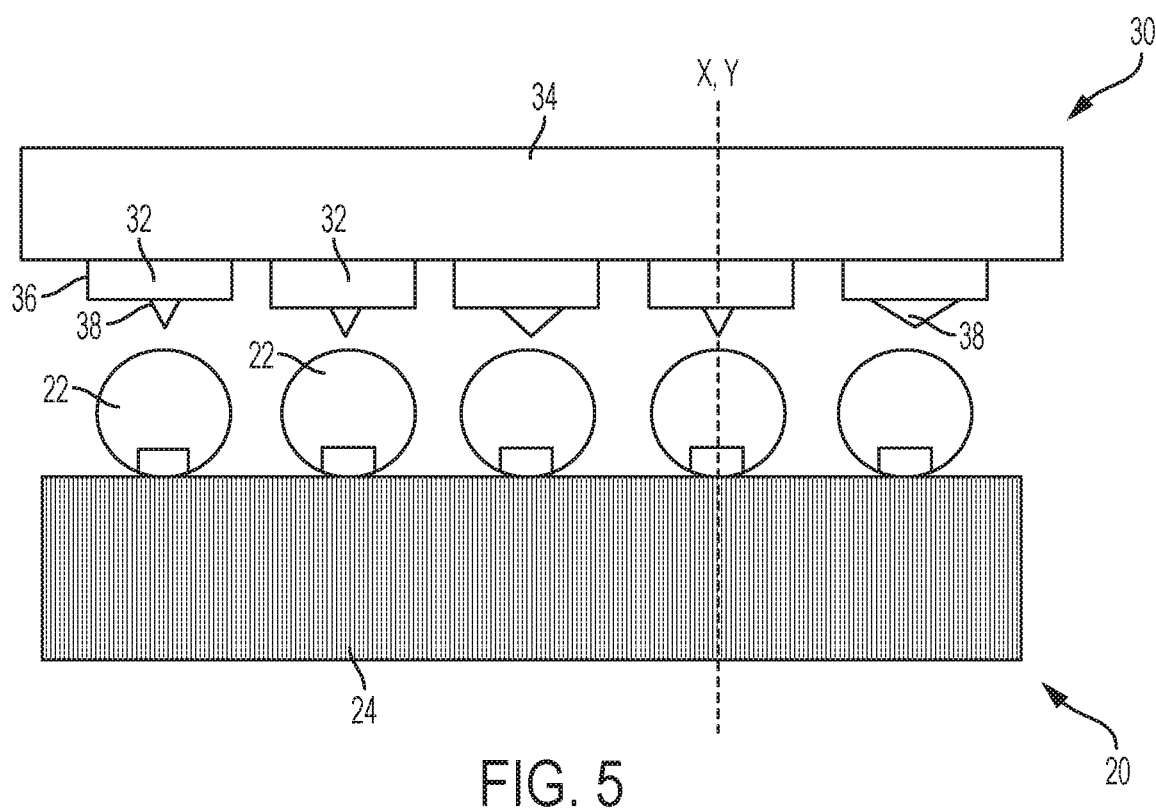
FIG. 5 is a side view of another system including an array of probes having varying configurations according to an embodiment.

Alternatively or in addition, at least one of the size (surface area) and shape of the surface 40 of the feature 38 configured to contact a C4 bump 22 may vary between adjacent probes 32 within an array 30. In an embodiment, this variation may be achieved by using a plurality of probes 32 having similarly shaped, but different size features 38. For example, as shown in FIG. 5, each of the plurality of probes 32 includes a generally frusto-conical or pyramid shaped feature 38. However, the cross-sectional area of at least one of the plurality of features 38 within a horizontal plane is different than the remainder of the plurality of features 38. As a result, the surface area of the features 38 configured to contact and engage an adjacent C4 bump 22 may vary.

Figure 6:
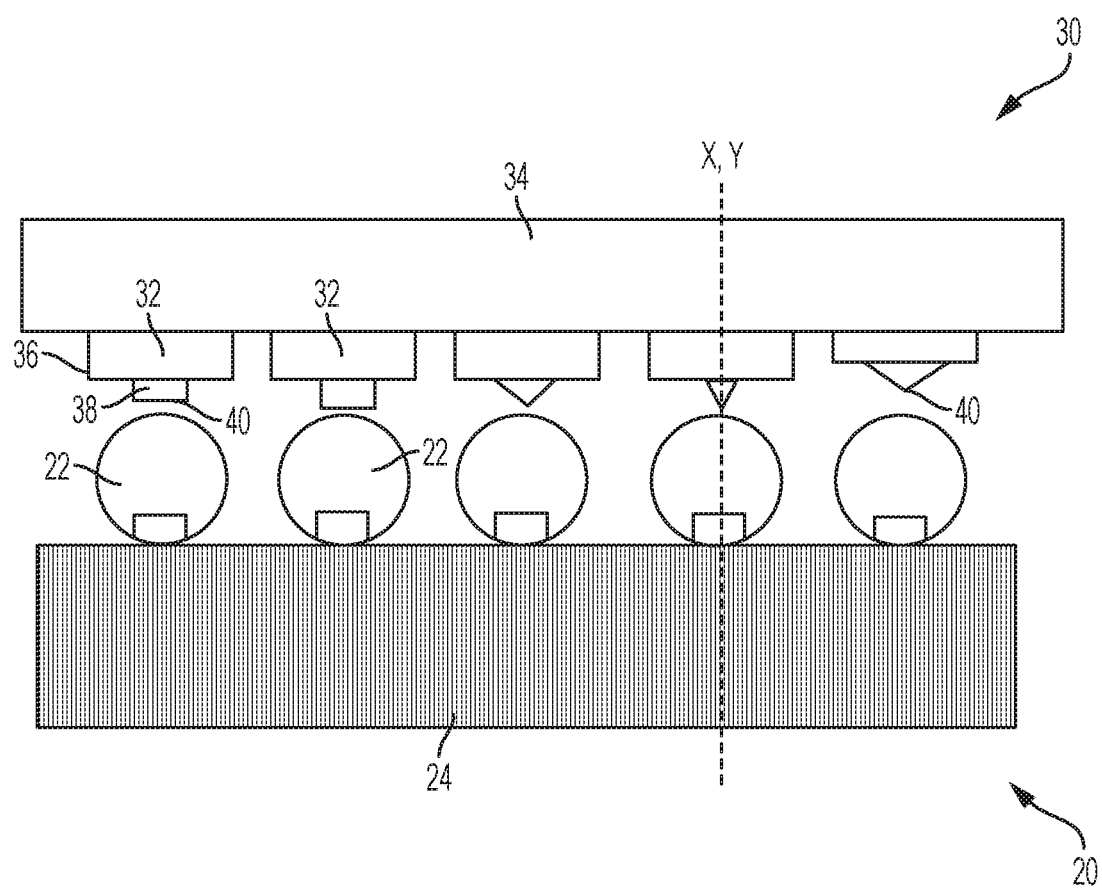
FIG. 6. is a side view of yet another system including an array of probes having varying configurations according to an embodiment.

In another embodiment, the type of probes 32, and therefore the type of features 38 for contacting the plurality of C4 bumps 22, within the array 30 may vary. For example, the array 30 illustrated in FIG. 6 includes a first probe 32 including a generally cylindrical feature 38 having a generally constant cross-sectional area over its height and a second probe 32 including a generally frusto-conical or pyramid-shaped feature 38. As a result, the size and/or shape of the surface 40 of the feature 38 configured to contact a corresponding C4 bump 22 is different between the probes 32. It should be understood that the probe configurations illustrated and described herein are intended as an example only, and a probe 32 having a feature 38 of any configuration is within the scope of the disclosure.

Figure 7:
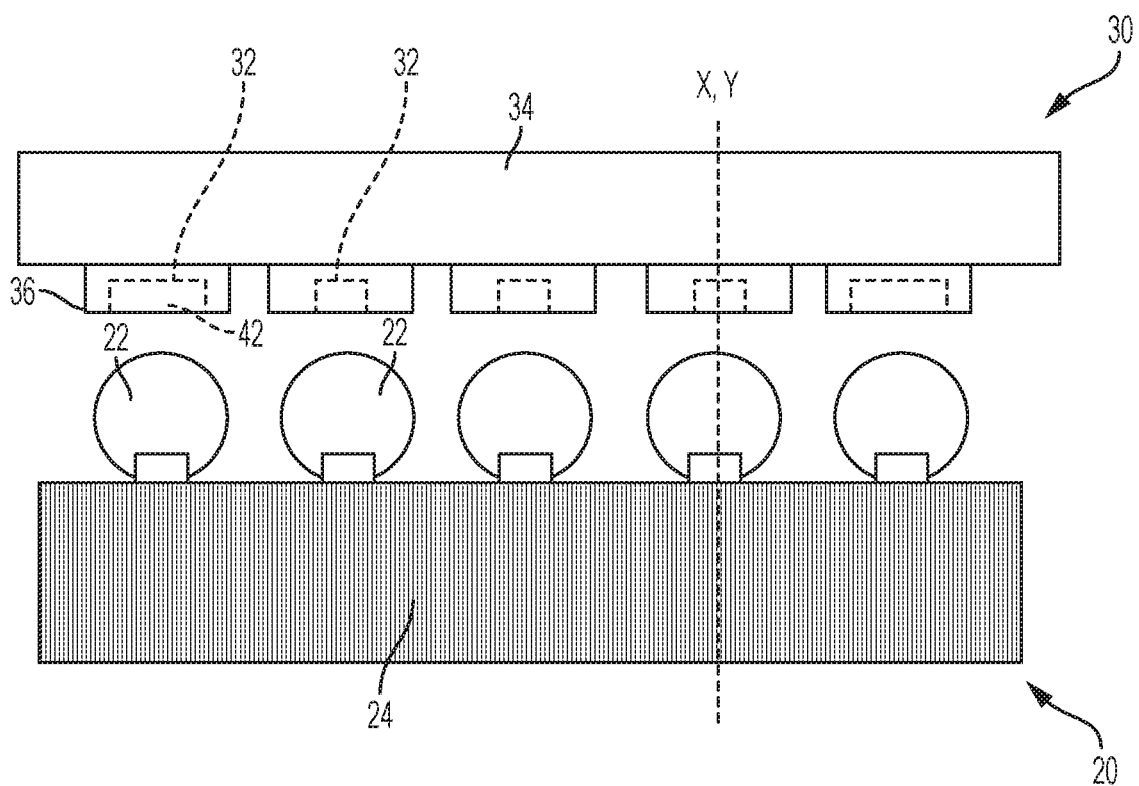
FIG. 7 is a side view of another system including an array of probes having varying configurations according to an embodiment.
Figure 8:
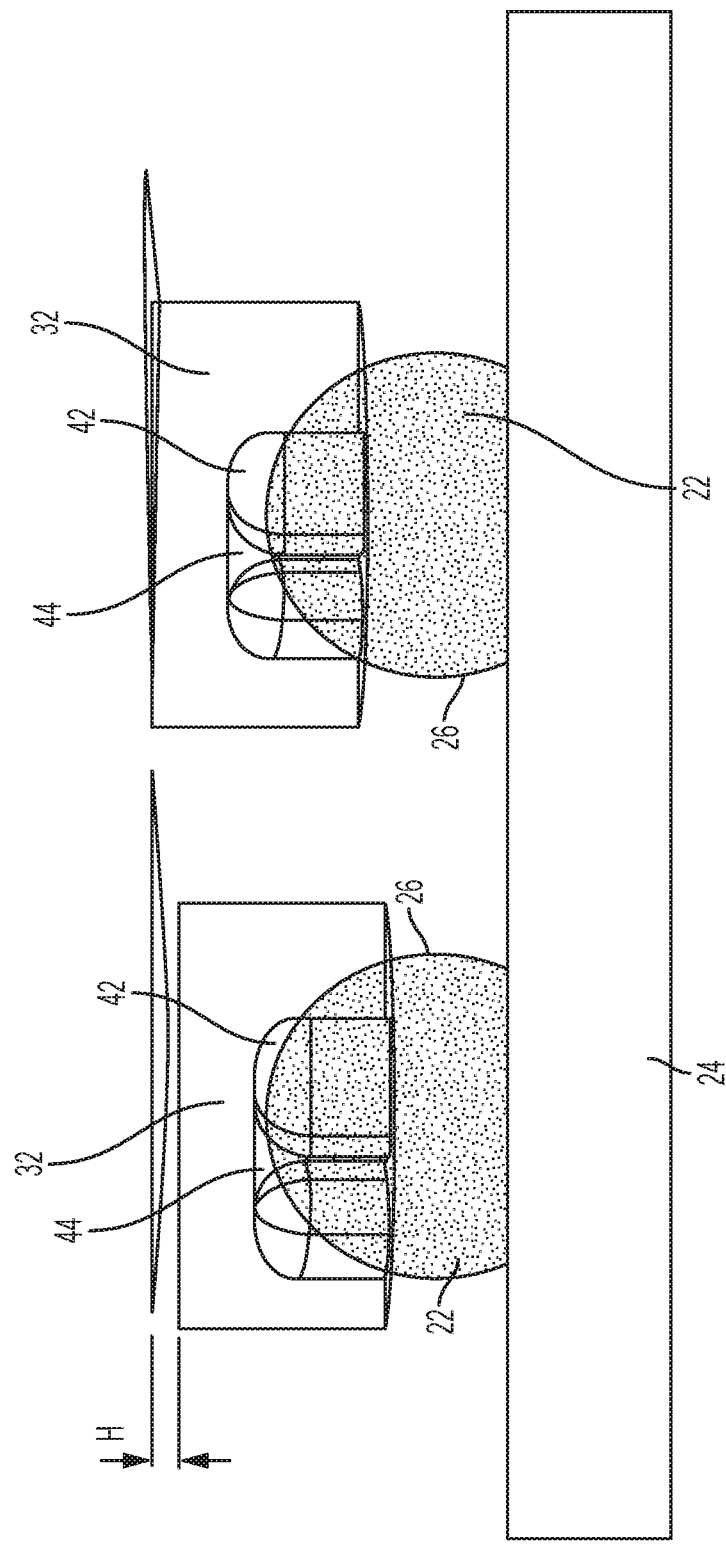
FIG. 8 is a cross-sectional view of two adjacent probes of an array an offset in contact height to compensate for substrate deflection under test load according to an embodiment.

In another embodiment, as illustrated in FIGS. 7 and 8, one or more of the probes 32 may include a cavity 42 within which one or more features 44 configured to contact the exterior surface 26 of the C4 bump 22 are located. In the illustrated, non-limiting embodiment, the features 44 include blades that extend generally inwardly from the periphery of the cavity 42 towards a central axis thereof. In an embodiment, the diameter of the cavity 42 of each probe 32 may vary such that each probe would contact a corresponding spherical surface of the C4 bump 22 at a different height. The variation in diameter could be selected to achieve a predetermined offset, illustrated schematically at H in FIG. 8, in the contact positions. It should also be understood that the variations in probe configuration within an array 30 illustrated and described herein are intended as an example only and that variations are also within the scope of the disclosure.

By designing an array 30 such that each probe 32 has a specific configuration dependent on the position of the probe 32 within the array 30 and an expected or known deflection of the support structure 34 to occur at that location, the contact that occurs between each probe 32 and a corresponding C4 bump 22, and therefore the load that is applied to each C4 bump 22 may be optimized. That is to say, uniformity can be achieved across the array, or certain probes could be targeted to provide increased or decreased contact relative to others.

The foregoing detailed description of the embodiments is used to further clearly describe the features and spirit of the present invention. The foregoing description for each embodiment is not intended to limit the scope of the present invention. All kinds of modifications made to the foregoing embodiments and equivalent arrangements should fall within the protected scope of the present invention. Hence, the scope of the present invention should be explained most widely according to the claims described thereafter in connection with the detailed description, and should cover all the possibly equivalent variations and equivalent arrangements.

The invention claimed is:

1. A system for testing functionality of die on a wafer including contacts, comprising:
    a support structure;
    probes mounted to the support structure in an array, wherein a configuration of each probe varies in shape or dimension from a neighboring probe based on a position thereof within the array to maintain uniform engagement between the probes and a corresponding contact across the array,
    wherein each probe has an axis along which a probe length is measurable and which is aligned with an axis of a corresponding contact and, with each probe contacting the corresponding contact, a distance between the support structure and the contact is less than each probe length.

2. The system according to claim 1, wherein the configuration of each probe is dependent on a deflection of the support structure, which is measured or modeled under a test load.

3. The system according to claim 1, wherein a contact area between each probe and the corresponding contact is substantially uniform across the array.

4. The system according to claim 1, wherein a displaced solder volume between each probe and the corresponding contact is substantially uniform across the array.

5. The system according to claim 1, wherein a contact force applied by each probe to the corresponding contact is substantially uniform across the array.

6. The system according to claim 1, wherein a configuration of at least one probe within the array is different due to variance in shape or dimension from a remainder of the probes.

7. The system according to claim 6, wherein a geometry of the at least one probe within the array is different from the remainder of the probes.

8. The system according to claim 7, wherein an overall height of the at least one probe within the array is different from the remainder of the probes.

9. The system according to claim 7, wherein a shape of the at least one probe within the array is different from the remainder of the probes.

10. The system according to claim 7, wherein a surface area of a contact surface of the at least one probe within the array is different from the remainder of the probes.

11. A system for testing functionality of die on a wafer including contacts, comprising:
    a support structure;
    probes mounted to the support structure in an array, wherein a configuration of each probes varies in shape or dimension from a neighboring probe and is selected based on a deflection of the support structure at a position associated therewith,
    wherein each probe has an axis along which a probe length is measurable and which is aligned with an axis of a corresponding contact and, with each probe contacting the corresponding contact, a distance between the support structure and the contact is less than each probe length.

12. The system according to claim 11, wherein each probe is configured to engage the corresponding contacts and a contact area between each probe and the corresponding contact is substantially uniform across the array.

13. The system according to claim 11, wherein each probe is configured to engage the corresponding contacts and a displaced solder volume between each probe and the corresponding contact is substantially uniform across the array.

14. The system according to claim 11, wherein each probes is configured to engage the corresponding contacts and a contact force applied by each probe to the corresponding contact is substantially uniform across the array.

15. The system according to claim 11, wherein a configuration of at least one probe is different from a remainder of the probes.

16. A method of forming a probe array comprising:
    measuring or modeling support structure deflection of a support structure under a test load;
    determining an expected value of the support structure deflection from the measuring or modeling; and
    connecting probes to the support structure, wherein a configuration of each probe varies in shape or dimension from a neighboring probe and is dependent on the expected value of the support structure deflection at a position thereof.

17. The method according to claim 16, wherein a configuration of at least one probe is different from a remainder of the probes.

18. The method according to claim 17, wherein a geometry of the at least one probe is different from the remainder of the probes.

19. The method according to claim 18, wherein an overall height of the at least one probe is different from the remainder of the probes.

20. The method according to claim 18, wherein a shape of the at least one probe is different from the remainder of the probes.

21. The method according to claim 18, wherein a surface area of a contact surface of the at least one probe is different from the remainder of the probes.

* * * * *